US 6,661,245 B1

(12) United States Patent
Reis et al.

(10) Patent No.: US 6,661,245 B1
(45) Date of Patent: *Dec. 9, 2003

(54) METHOD TO ELIMINATE WIRING OF ELECTRICAL FIXTURES USING SPRING PROBES

(75) Inventors: Robert J. Reis, Winona, MN (US); Harold M. Buettner, Byron, MN (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 841 days.

(21) Appl. No.: 08/741,449

(22) Filed: Oct. 31, 1996

(51) Int. Cl.[7] .............................. G01R 31/02
(52) U.S. Cl. ........................ 324/761; 324/754
(58) Field of Search ............... 324/72.5, 754, 324/755, 761; 439/68, 482, 751, 84, 874, 82

(56) References Cited

U.S. PATENT DOCUMENTS

| 4,606,589 A | * | 8/1986 | Elsbree, Jr. et al. ......... 439/82 |
| 4,721,908 A | | 1/1988 | Driller et al. .............. 324/158 |
| 4,749,945 A | | 6/1988 | Bonifert et al. ............ 324/158 |
| 4,857,018 A | * | 8/1989 | Pickles ....................... 439/751 |
| 4,857,019 A | | 8/1989 | Brubaker et al. ........... 439/751 |
| 5,367,254 A | | 11/1994 | Faure et al. ............... 324/761 |
| 5,411,418 A | * | 5/1995 | Welsh et al. ............... 439/751 |
| 5,500,606 A | | 3/1996 | Holmes ...................... 324/761 |

OTHER PUBLICATIONS

IBM Technical Disclosure Bulletin vol. 33 No. 3B, p. 55, Aug. 1990.
IBM Technical Disclosure Bulletin vol. 34 No. 2, p. 78–79, Jul. 1991.
IBM Technical Disclosure Bulletin vol. 38 no. 2, p. 117, Feb. 1995.
Testron *Teradyne L200/L300* circular (unavailable date).
Testron Inc. *Teradyne Z Series* circular (unavailable date).
Testron, Inc. *Test Probes* circular (unavailable date).

* cited by examiner

*Primary Examiner*—Vinh P. Nguyen
(74) *Attorney, Agent, or Firm*—Bracewell & Patterson LLP

(57) ABSTRACT

Electrical contact to a probe receptacle in a test fixture is provided by fitting the probe receptacle with a compliant pin and inserting the compliant pin into a plated through hole in an interface printed circuit board. The plated through hole is electrically connected to a test interface region on the printed circuit board. The compliant pin provides both electrical contact to and mechanical retention of the interface printed circuit board.

20 Claims, 3 Drawing Sheets

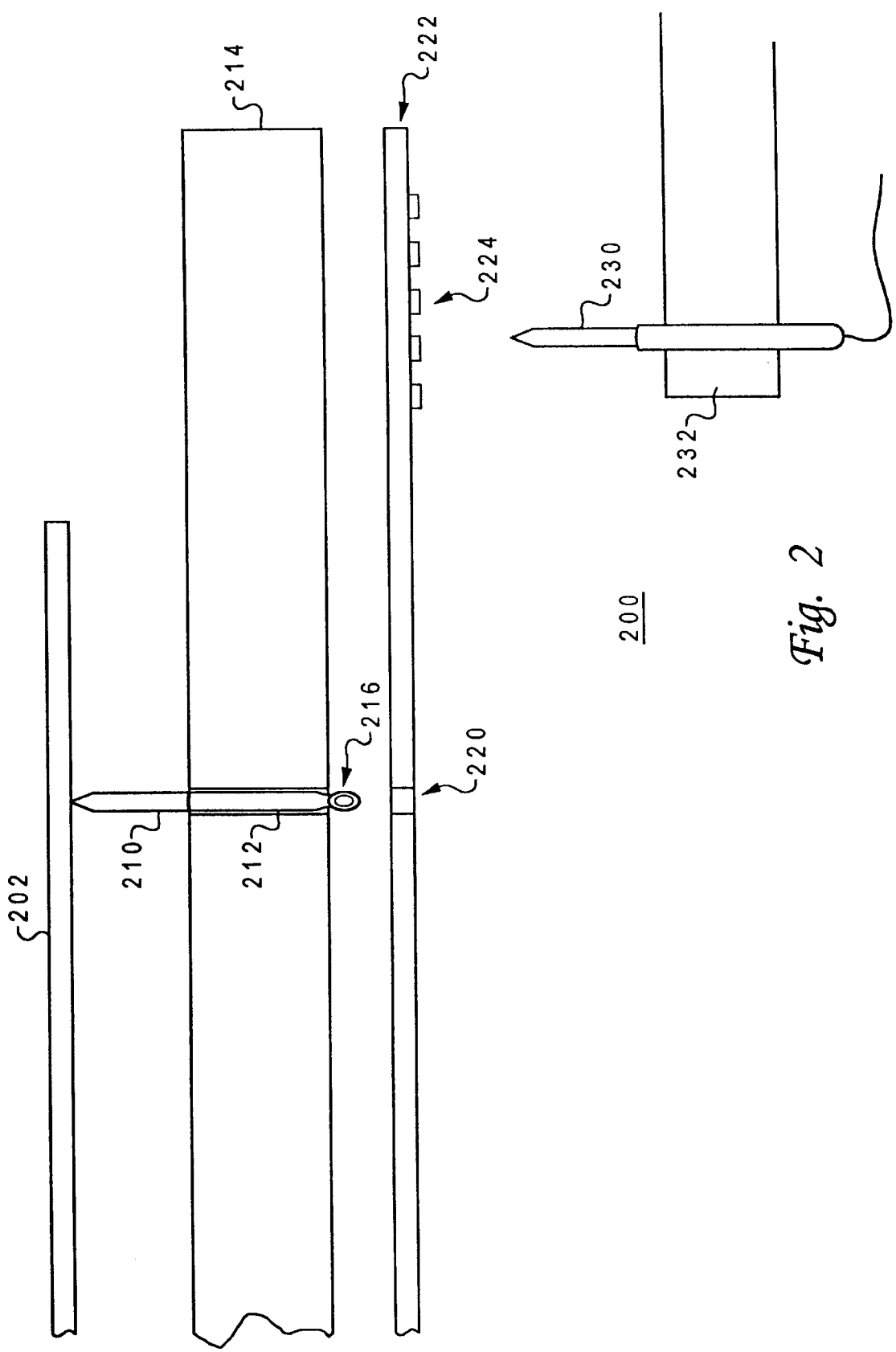

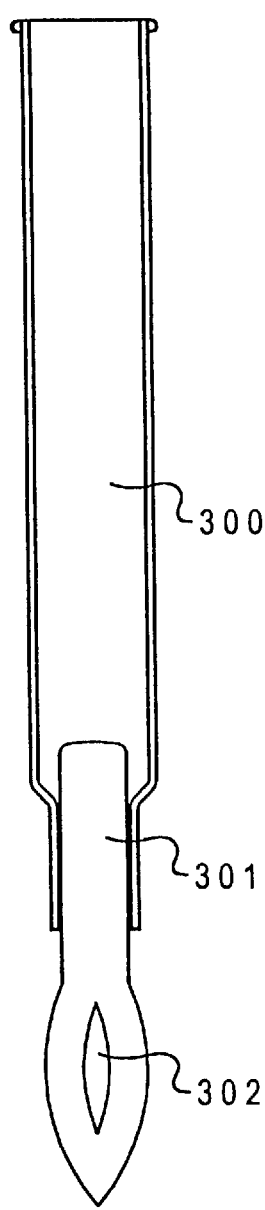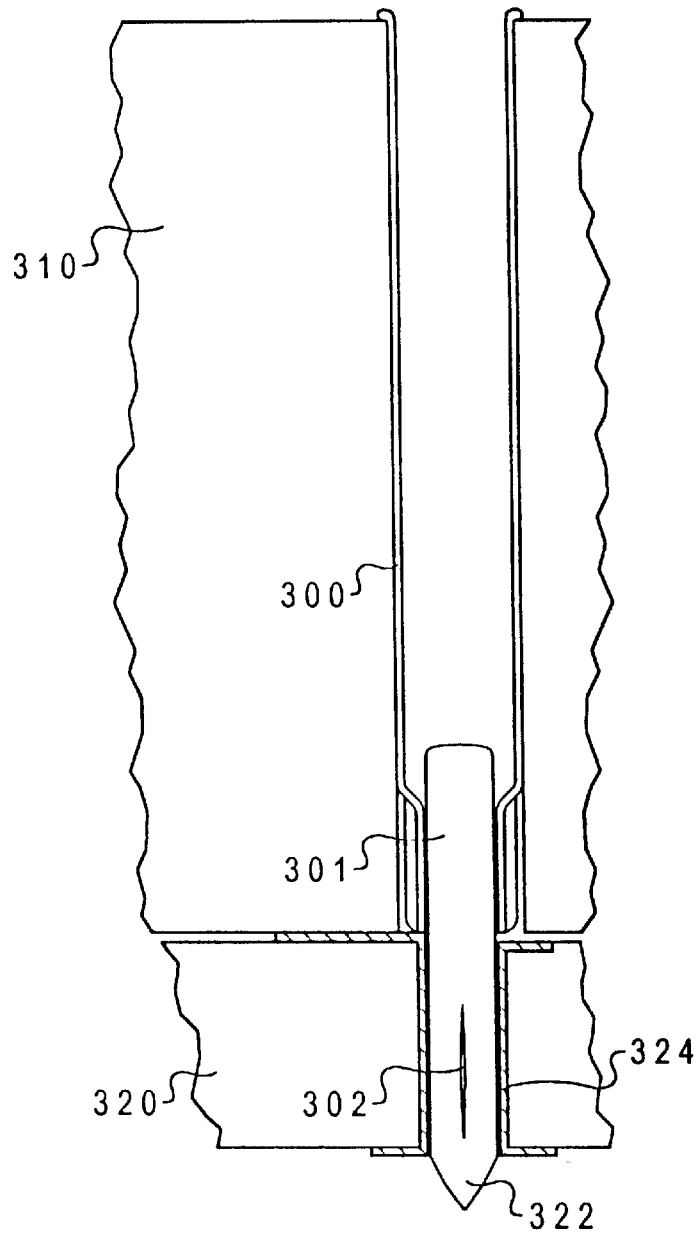
Fig. 3a
Fig. 3b

METHOD TO ELIMINATE WIRING OF ELECTRICAL FIXTURES USING SPRING PROBES

BACKGROUND OF THE INVENTION

1. Technical Field

The present invention relates in general to test fixtures and in particular to electrically contacting spring probe receptacles in test fixtures. Still more particularly, the present invention relates to a method and apparatus for reliably making electrical contact to spring probe receptacles in test fixtures in a manner which reduces manufacturing costs and lead times.

2. Description of the Related Art

Test fixtures are devices used to test printed circuit boards. Generally electrical contact to the printed circuit board to be tested is made through the use of spring probes strategically situated in a receiver plate. The receiver plate is drilled at the appropriate locations and the holes populated with spring probe receptacles. Spring probes are mounted in the spring probe receptacles to provide electrical contact for the purposes of test or process parameter adjustment. Target printed circuit boards are loaded and registered to the fixture, contacted via the spring probes, and tested.

Current practice in fabricating test fixtures involves wire wrapping the tail stocks of the spring probe receptacles for connection to a test interface area, as shown in FIG. 1. Alternatively, connection leads are point-to-point soldered to the probe receptacle tail stock. Both methods are expensive and error prone, contributing to the cost of wiring and debugging the text fixture. Both methods also add several weeks to several months to the manufacturing lead time for test fixtures and precipitate maintenance requirements during the life of the test fixture.

Therefore it would be desirable to have a method and apparatus for electrically connecting spring probe receptacles in a test fixture to a test set in a manner which reduces manufacturing costs, improves reliability of the electrical connection, and requires a shorter manufacturing lead time.

SUMMARY OF THE INVENTION

It is therefore one object of the present invention to provide an improved test fixture.

It is another object of the present invention to provide and improved method and apparatus for electrically contacting spring probe receptacles in test fixtures.

It is yet another object of the present invention to provide a method and apparatus for reliably making electrical contact to spring probe receptacles in test fixtures in a manner which reduces manufacturing costs and lead times.

The foregoing objects are achieved as is now described. Electrical contact to a probe receptacle in a test fixture is provided by fitting the probe receptacle with a compliant pin and inserting the compliant pin into a plated through hole in an interface printed circuit board. The plated through hole is electrically connected to a test interface region on the printed circuit board. The compliant pin provides both electrical contact to and mechanical retention of the interface printed circuit board.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 2 is an apparatus for electrically contacting spring probe receptacles in accordance with a preferred embodiment of the present invention.

FIGS. 3A and 3B depict a detail of the electrical connection of spring probe receptacles in accordance with the present invention.

DETAILED DESCRIPTION OF THE PREFERRED EMBODIMENT

Figure 1:
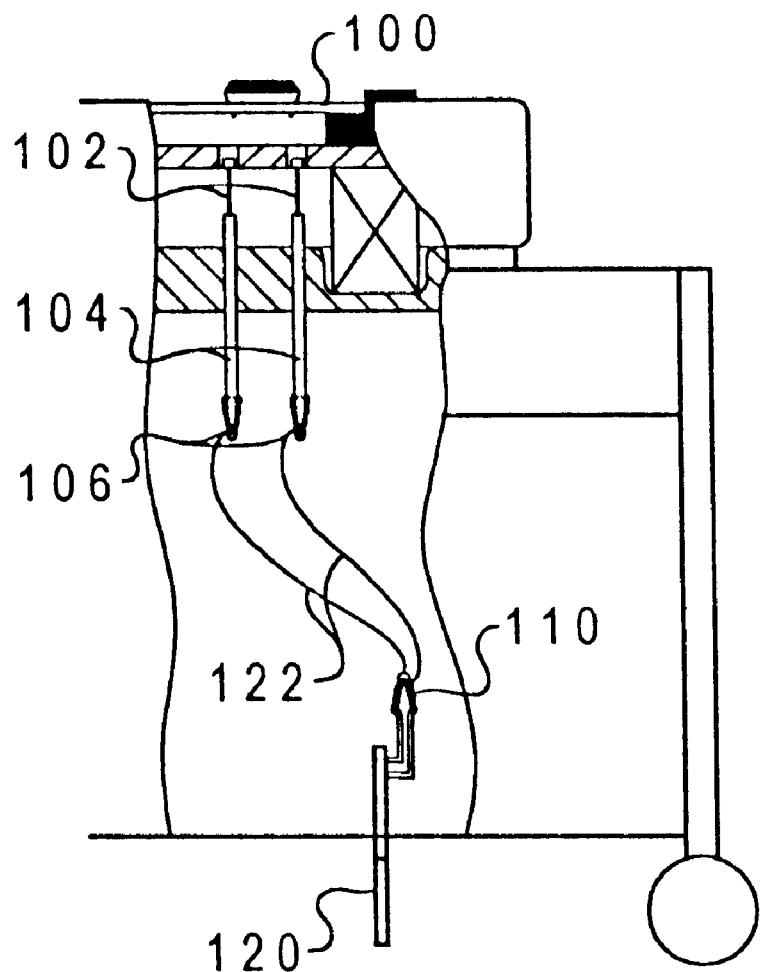
FIG. 1 depicts a prior art method of electrically contacting spring probe receptacles in a test fixture.

With reference now to the figures, and in particular with reference to FIG. 1, a prior art method of electrically contacting spring probe receptacles in a test fixture is depicted. A printed circuit board 100 to be tested is contacted by spring probes 102 mounted in spring probe receptacles 104. The tail stocks of spring probe receptacles 104 are equipped with wire wrap posts 106. Similar wire wrap posts 110 are provided on test set interface 120. Electrical connection between spring probe receptacles 104 and test set interface 120 is provided by electrical leads 122 wrapped at one end around posts 106 on spring probe receptacles 104 and at the other end around posts 110 on test set interface 120, which may be a connector block or a pin contacted via a spring probe to the test set.

Referring to FIG. 2, an apparatus for electrically contacting spring probe receptacles in a test fixture in accordance with a preferred embodiment of the present invention is illustrated. Test fixture 200 electrically contacts target printed circuit board 202 via spring probe 210. Spring probe 210 is mounted within spring probe receptacle 212 press fitted in probe plate 214. The tail stock of spring probe receptacle 212 is fitted with a compliant pin 216. Compliant pin 216 may be inserted into plated through hole 220 in interface printed circuit board 222. As in the depicted example, interface printed circuit board 222 may be a standard 0.0625" thick FR-4 composite containing multiple signal planes. Electrical leads on interface printed circuit board 222 may connect plated through hole 220 to a test set interface pad 224, which may be probed by a test set interface probe 230 in test set 232. Depending on the design of test set 232, the test set interface formed on a portion of interface printed circuit board 222 may be comprised of interface pads or plated through holes selectively receiving interconnect posts or connector blocks.

While the example depicted shows only one spring probe receptacle, those skilled in the art will recognize that the present invention is not limited to a single probe. Probe plate 214 and interface printed circuit board 222 may be drilled with the desired probe pattern and appropriate hole sizes for spring probe receptacles and compliant pins. Holes for receiving compliant pins in interface printed circuit board 222, which may be manufactured in the same manner as product printed circuit boards, are plated through and electrically connected to test set interface points. Interface printed circuit board 222 may be registered with probe plate 214 using two roll pins and the probe pattern populated with press fitted spring probe receptacles. Compliant pins on the tail stocks of spring probe receptacles provide both electrical contact to the spring probe receptacles and mechanical retention of interface printed circuit board 222 to probe plate 214.

With reference now to FIGS. 3A and 3B, a detail of the electrical connection of spring probe receptacles in accordance with the present invention is depicted. Unmounted spring probe receptacles 300 are fitted at the tail stocks with compliant pins 301. Compliant pins 301 are round or square posts formed with an oblate area 302 (similar to the eye of a needle) compressible when the pin is press fitted into a deliberately undersized, plated through hole, providing both electrical contact and mechanical retention. Compliant pins 301 are used in commercial electronics products for mating connectors. Compliant pins 301 are fitted to spring probe receptacle 300 in FIGS. 3A and 3B by crimping, welding, or other suitable means.

In FIG. 3B, when spring probe receptacle 300 is press fitted into probe plate 310 with interface printed circuit board 320 registered, compliant pin 301 is forced into plated through hole 322 in interface printed circuit board 320. Oblate area 302 of compliant pin 301 is compressed on entry into plated through hole 322, establishing electrical connection to plating 324 in plated through hole 322 and providing mechanical retention of interface printed circuit board 320 to probe plate 310.

The solution of the present invention eliminates the need to wire wrap connections from spring probe receptacles to the test set interface, thereby eliminating the lengthy process required for individually wiring each wiring pair. The possibilities of miswiring the test fixture, a fairly common occurrence, and of poor wire wrap electrical connections are also eliminated. Time wasted during debugging and test verification to correct miswiring and fix poor electrical connections is also eliminated.

The interface printed circuit board may be designed using the same data used to design the target printed circuit board, and may be manufactured at the same time as the prototype product assemblies using the same processes. The prospect of handling damage to discrete wiring in the test fixture during manufacture is eliminated. Tooling time is substantially reduced, making test fixtures available on a manufacturing lead time of only a few weeks.

The method of the present invention also allows test fixtures to be refurbished or refitted at the end of the product life for the target printed circuit boards. The interface printed circuit board may be freed from the probe plate by pressing out the compliant pins which provide mechanical retention. Typically the compliant pins may be pressed in and out of the receiving holes approximately 50 times without damage or degradation of the resulting electrical contact. Once the interface printed circuit board is removed, the spring probe receptacles may be removed from the probe plate. The probe plate may then be redrilled if necessary to receive additional receptacles or to receive receptacles at different locations. If the probe plate cannot be redrilled, the receptacles may be salvaged for use with a new probe plate. The redrilled probe plate or new probe plate is then populated with spring probe receptacles and mated with a new interface printed circuit board.

Since the bulk of fixture costs are in the spring probes, spring probe receptacles, and wire wrapping, the present invention both reduces initial costs of test fixtures and allows reuse of spring probes and receptacles in refitted or refurbished test fixtures. Wire wrapped or soldered spring probe receptacles are presently scrapped with the test fixture due to the cost of stripping the wiring or desoldering the connections. With the present method, spring probe receptacles may be quickly and inexpensively salvaged from a test fixture.

Use of the present invention reduces manufacturing costs, improves reliability of the electrical connection, and requires a shorter lead time for manufacturing test fixtures. Fixture manufacturing lead times often gate product releases schedules, resulting in either reduced test effectiveness or product delay. Total manufacturing costs for a given product are also reduced using the present invention, and manufacturing may ramp up faster during product introduction.

While the invention has been particularly shown and described with reference to a preferred embodiment, it will be understood by those skilled in the art that various changes in form and detail may be made therein without departing from the spirit and scope of the invention.

What is claimed is:

1. A method of providing electrical contact in a test fixture, comprising:

fitting a spring probe receptacle for a spring probe with a compliant pin; and inserting the complaint pin into a plated through hole in an interface printed circuit board, wherein electrical contact between the spring probe receptacle and the interface printed circuit board is provided.

2. The method of claim 1 further comprising electrically connecting the plated through hole to a test set interface region on the interface printed circuit board.

3. The method of claim 1 wherein the spring probe receptacle extends through a probe plate.

4. The method of claim 1 wherein the step of inserting the complaint pin into the plated through hole in the interface printed circuit board further comprises:

providing mechanical retention of the spring probe receptacle to the interface printed circuit board.

5. The method of claim 1 further comprising:

fitting each of a plurality of spring probe receptacles with a complaint pin; and inserting the complaint pin on each of the spring probe receptacles into one of a plurality of plated through holes in an interface printed circuit board.

6. The method of claim 5 further comprising electrically connecting each plated through hole to a test set interface region on the interface printed circuit board.

7. The method of claim 5 wherein each of the plurality of spring probe receptacles extends through a probe plate.

8. The method of claim 5 wherein the step of inserting the complaint pin on each of the spring probe receptacles into one of a plurality of plated through holes in the interface printed circuit board further comprises:

providing mechanical retention of a respective spring probe receptacle to the interface printed circuit board.

9. A probe receptacle contact structure in a test fixture, comprising:

at least one spring probe receptacle having a complaint pin at one end; and an interface board having at least one plated through hole, wherein the complaint pin is received and retained by the at least one plated through hole.

10. The probe receptacle contact structure of claim 9 further comprising:

a probe plate having at least one hole;

wherein the spring probe receptacle is inserted into the at least one hole such that the complaint pin extends beyond a surface of the probe plate and wherein the interface board is adjacent to the surface of the probe plate.

11. The probe receptacle contact structure of claim 9 further comprising;

an electrical connection on the interface board between the at least one plated through hole and a test set interface region on the interface board.

12. The probe receptacle contact structure of claim 11, wherein the test set interface region comprises a test set interface pad situated on the interface board for contact with a test set interface probe.

13. The probe receptacle contact structure of claim 9 further comprising:

a plurality of probe receptacles each having a complaint pin at one end; and an interface board having a plurality of plated through holes, the complaint pin on each of the plurality of probe receptacles received and retained by one of said plated through holes.

14. The probe receptacle contact signature of claim 9, further comprising:

a spring probe within the spring probe receptacle, the complaint pin providing electrical connection between the interface board and the spring probe.

15. A spring probe receptacle contact structure, comprising:

a spring probe receptacle adapted to receive a spring probe within an interval cavity through an opening at one end and having a complaint pin fitted within and protruding from an opening in an opposite end.

16. The spring probe receptacle contact structure of claim 15, wherein the complaint pin is compressible when press fitted into a deliberately undersized hole, wherein the spring probe contact structure further comprises:

an interface board having at least one plated through hole, wherein the at least one hole is deliberately undersized for receiving the complaint pin and the complaint pint is received and retained by the at least one plated through hole.

17. The spring probe receptacle contact structure of claim 16, further comprising:

a probe plate having at least one hole;

wherein the spring probe receptacle is inserted into the at lease one hole such that the pin extends beyond a surface of the probe plate and wherein the interface board is adjacent to the surface of the probe plate.

18. The spring probe receptacle contact structure of claim 16 further comprising:

an electrical connection on the interface board between the at lease one plated through hole and a test set interface region on the interface board.

19. The spring probe receptacle contact structure of claim 16 further comprising:

a plurality of spring probe receptacles each having a complaint pin protruding from an end, each complaint pin having a void and being compressible when the complaint pin is press fitted into a deliberately undersized hole; and an interface board having a plurality of plated through holes, each plated through hole being deliberately undersized for receiving a complaint pin and each complaint pin being received and retained by one of the plurality of holes.

20. The spring probe receptacle contact structure of claim 15, wherein the complaint pin includes a void and is compressible when press fitted into a plated through hole within an interface board which is deliberately undersized for receiving and retaining the complaint pin.

\* \* \* \* \*